United States Patent
Steiner et al.

(10) Patent No.: US 6,798,043 B2
(45) Date of Patent: Sep. 28, 2004

(54) STRUCTURE AND METHOD FOR ISOLATING POROUS LOW-K DIELECTRIC FILMS

(75) Inventors: Kurt G. Steiner, Orlando, FL (US); Susan Vitkavage, Orlando, FL (US); Steve Lytle, Orlando, FL (US); Gerald Gibson, Orlando, FL (US); Scott Jessen, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 121 days.

(21) Appl. No.: 10/038,352

(22) Filed: Jan. 2, 2002

(65) Prior Publication Data

US 2003/0001273 A1 Jan. 2, 2003

Related U.S. Application Data

(60) Provisional application No. 60/301,295, filed on Jun. 28, 2001.

(51) Int. Cl.[7] .......................... H01L 23/58; H01L 23/48
(52) U.S. Cl. ........................ 257/637; 257/642; 257/760
(58) Field of Search ................................ 257/635, 637, 257/638–644, 760; 438/624, 633, 692

(56) References Cited

U.S. PATENT DOCUMENTS

| | | | |
|---|---|---|---|
| 5,916,823 A | 6/1999 | Lou et al. | |
| 6,069,069 A | 5/2000 | Chooi et al. | |
| 6,159,661 A | 12/2000 | Huang et al. | |
| 6,191,028 B1 | * 2/2001 | Huang et al. | |
| 6,251,802 B1 | * 6/2001 | Moore et al. | |
| 6,323,121 B1 | * 11/2001 | Liu et al. | |
| 6,420,261 B2 | * 7/2002 | Kudo | |
| 2001/0005546 A1 | 6/2001 | Cheung et al. | |

FOREIGN PATENT DOCUMENTS

| | | |
|---|---|---|
| EP | 0 975 010 A1 | 1/2000 |
| WO | WO 02/052642 A2 | 7/2002 |

* cited by examiner

Primary Examiner—Ha Tran Nguyen
(74) Attorney, Agent, or Firm—James H. Beusse; Beusse Brownlee Wolter Mora & Maire, P.A.

(57) ABSTRACT

A film structure includes low-k dielectric films and N—H base source films such as barrier layer films, etch-stop films and hardmask films. Interposed between the low-k dielectric film and adjacent N—H base film is a TEOS oxide film which suppresses the diffusion of amines or other N—H bases from the N—H base source film to the low-k dielectric film. The film structure may be patterned using DUV lithography and a chemically amplified photoresist since there are no base groups present in the low-k dielectric films to neutralize the acid catalysts in the chemically amplified photoresist.

18 Claims, 4 Drawing Sheets

STRUCTURE AND METHOD FOR ISOLATING POROUS LOW-K DIELECTRIC FILMS

RELATED APPLICATION

This application claims priority of U.S. provisional application serial No. 60/301,295, entitled FULL VIA FIRST INTEGRATION METHOD OF MANUFACTURE, and filed on Jun. 28, 2001, the contents of which are herein incorporated by reference.

FIELD OF THE INVENTION

The present invention relates most generally to semiconductor devices and methods for manufacturing the same. More particularly, the present invention provides a method and structure for preventing base groups from becoming nested in low-k dielectric materials and subsequently rendering photoresists insoluble.

BACKGROUND OF THE INVENTION

Deep ultra-violet (DUV) lithography is widely used in the fabrication of advanced VLSI (Very Large Scale Integration) semiconductor devices. Chemically amplified DUV photoresists improve the performance of the lithography systems and improve device feature resolution. Low dielectric constant (low-k) dielectrics are favored in today's semiconductor manufacturing industry because of the performance improvements they provide by way of reducing parasitic capacitance, reducing propagation delay and therefore increasing device speed. The use of copper interconnect features is also favored to reduce line resistance of the interconnect lines. Typical copper interconnect schemes incorporate damascene manufacturing techniques to define the interconnect paths. A dual damascene approach is favored because it provides lower cost processing, improved level-to-level alignment tolerance and thus allows for tighter design rules and improved performance.

A shortcoming associated with the use of low-k dielectrics in conjunction with copper interconnect lines and chemically amplified photoresists used in DUV lithography, is that base groups which become nested in porous low-k dielectric materials, can interact with the acid catalysts included in chemically amplified photoresists to render the exposed photoresist insoluble in developer. This unwanted residual photoresist distorts the pattern being formed and is difficult to remove. Base groups such as amines or other N—H base groups, are typically produced in association with conventional hard mask films, etch stop layers and barrier films used in the film stack that also includes the low-k dielectric films, and which is advantageously used in dual damascene processing. Etch stop layers and barrier films are commonly nitrogen-containing films.

It is therefore desirable to enjoy the benefits provided by copper interconnect technology, low-k dielectric films and chemically amplified photoresists in DUV lithography systems, without degrading the chemically amplified photoresist by interaction with base groups from low-k dielectric films.

SUMMARY OF THE INVENTION

The present invention provides a method and structure for isolating low-k dielectric layers from nitrogen base layers that include N—H base groups which are capable of diffusing from the nitrogen base layer and becoming nested in the low-k dielectric layer. The present invention provides an oxygen-containing layer disposed directly between the low-k dielectric layer and the nitrogen base layer.

The present invention also provides a process for forming a semiconductor product which includes forming at least one low-k dielectric film over a substrate, forming at least one N—H base film over the substrate using a source chemistry which includes ammonia, and forming a TEOS (tetraethyl orthosilicate) oxide film between at least one adjacent set of a low-k dielectric film and an N—H base film.

BRIEF DESCRIPTION OF THE DRAWING

The invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Like numerals denote like features throughout the specification and drawing. Included in the drawing are the following figures.

DETAILED DESCRIPTION

The present invention provides a method and structure for utilizing low-k dielectric films in a film stack commonly used in dual-damascene, VLSI (very large scale integration) processing technology. The film stack may include, in various exemplary embodiments, a hard mask film, an etch-stop film, and a barrier layer film. The film stack may be formed over a conductive interconnect wire or another substructure. The etch-stop layer, hard mask layer, and barrier layer may each be nitrogen base layers which include N—H base groups that are capable of diffusing therefrom. The nitrogen base layers may be nitrogen-containing films such as silicon nitride (SiN) or nitrogen-doped silicon carbide (SiC—N). Typical deposition chemistries used to form these nitride and carbide films include or produce ammonia, $NH_3$, which readily diffuses into and throughout the low-k dielectric material. The hardmask layer may be a silicon oxide film formed using nitrogen and nitrous oxide in the film formation chemistry. The hard mask, etch-stop layer and barrier layer may be formed using plasma enhanced chemical vapor deposition (PECVD) techniques, but other methods may be used alternatively. Ammonia or other nitrogen-containing gasses may be included as source gasses during the film formation process using PECVD. Ammonia, various amines and other N—H base groups such as amino-silanes may be used in the film-formation chemistry and/or may be by-products. According to conventional technologies, these species may diffuse into and throughout the porous low-k dielectric during the formation of the hard mask, etch-stop and barrier layer films, or these species may diffuse into the porous low-k dielectric materials after the film formation process is complete. Generally speaking, various amines, amino-silanes and other N—H base groups such as produced during the formation of the hardmask, etch-stop and barrier layer films can diffuse into the low-k dielectric films which typically bound the aforementioned films. The present invention provides an oxygen-containing film such as a TEOS oxide film directly between the low-k dielectric and the adjacent hardmask, etch-stop, barrier layer, or other nitrogen base films. The oxygen-containing film suppresses the diffusion of N—H and other base groups into the low-k dielectric films.

According to conventional arrangements in the prior art, the oxygen-containing, diffusion suppressing films are not present and the N—H bases or other base species diffuse into and throughout the typically porous low-k dielectric materials. From the low-k dielectric materials, these base species can diffuse into the photoresist materials which contact the low-k dielectric layers. This is illustrated in the prior art arrangement shown in FIG. 1.

Figure 1:
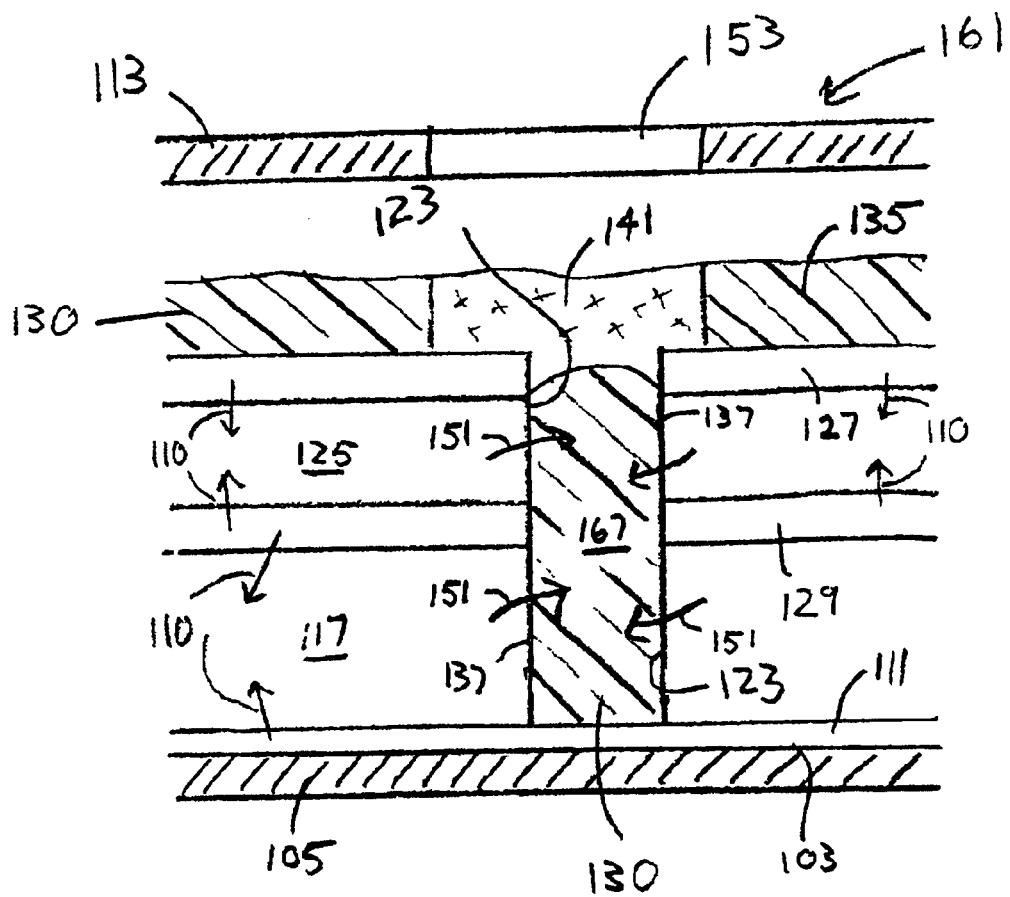
FIG. 1 is a cross-sectional view showing insoluble photoresist in an opening filmed in a film stack, according to the PRIOR ART.

FIG. 1 shows a PRIOR ART arrangement of opening 123 formed within a film stack. The film stack may include low-k dielectric films 117 and 125 which may be relatively porous films. The film stack also includes exemplary barrier layer 111, exemplary etch-stop layer 129 and exemplary hard mask layer 127. In the exemplary embodiment, one or more of barrier layer 111, etch-stop layer 129, and hard mask layer 127 may be a film such as a nitrogen-containing film and formed using ammonia or other gases which produce N—H base species during the film formation process and/or in the formed film. According to the exemplary embodiment in which PECVD is used to form the films, ammonia or other nitrogen gasses may be included as constituents of the plasma chemistry used to form the film. Amines or other N—H base groups may also be present in the plasma. As such, during the film formation process or subsequent to the formation of the film, various amines, amino-silanes and other N—H base groups may diffuse from barrier layer 111, etch-stop layer 129, and hard mask layer 127 into low-k dielectric films 117 and 125. Such diffusion of basic N—H species is indicated by arrows 110 shown in FIG. 1. In this manner, N—H base groups become nested within porous low-k dielectric layers 117 and 125. Opening 123 includes exposed sidewalls 137 of low-k dielectric materials.

Still referring to the PRIOR ART structure of FIG. 1, according to the dual-damascene processing scheme commonly used in VLSI processing, after opening 123 is formed, another damascene opening is formed in the film stack, and aligned over opening 123 to produce a dual-damascene or two-tiered opening. Such an opening is preferably formed by coating the substrate with a DUV photoresist film, then exposing portions of the preferably chemically amplified photoresist. Chemically amplified photoresist 130 is formed over the film stack and fills opening 123. Conventional photomask 161 includes transmissive sections 153 and opaque sections 113. Using DUV lithography, ultra-violet light shines through transmissive sections 153 and desirably activates the acid catalysts in the DUV, chemically amplified photoresist 130 to break bonds in the photoresist structure and render the photoresist soluble in developer. Portions 135 of photoresist 130 beneath opaque sections 113 of photomask 161 are not exposed and are therefore not soluble in developer. The entirety of photoresist sections under clear section 153 of mask 113 are desired to be rendered soluble in developer through acid catalyst activation by ultra-violet light. Portion 141 of photoresist 130 is such a soluble section. In the embodiment in which a dual-damascene opening is to be formed over existing opening 123, all portions of photoresist film 130 within opening 123 are desirably exposed and developed. Within section 167 of photoresist 130, however, base groups from the low-k dielectric films 117 and 125, diffuse through sidewalls 137 and into photoresist 130 as indicated by arrows 151. These amine, N—H base groups interact with and neutralize the acid catalyst of the DUV photoresist. The neutralized acid catalysts are therefore not activated when exposed by DUV light. As such, portion 167 is rendered insoluble in developer and will remain and distort the pattern according to conventional methods of the prior art.

Figure 2:
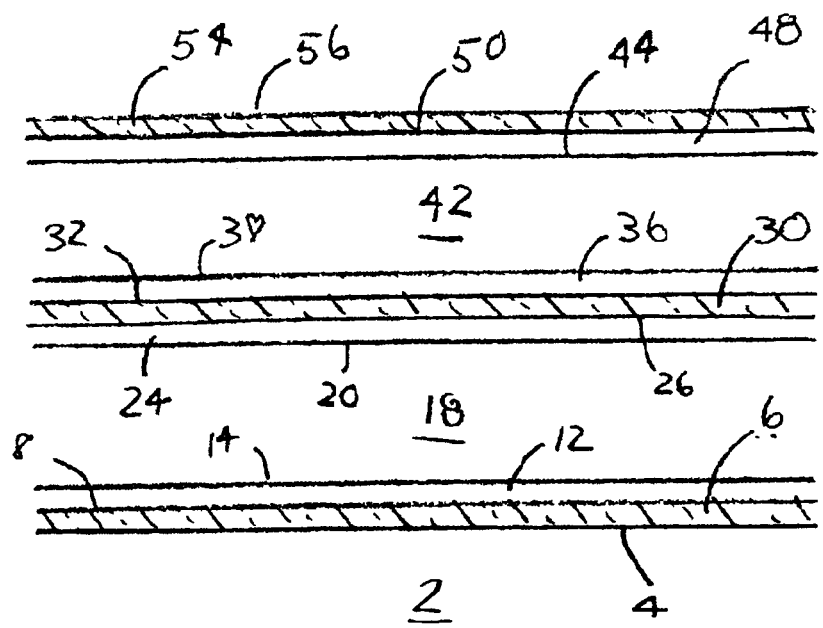
FIG. 2 is a cross-sectional view showing an exemplary film stack according to the present invention.

FIG. 2 shows an exemplary film stack according to the present invention. Substructure 2 includes surface 4, over which the exemplary film stack of the present invention is formed. Surface 4 may be the surface of a semiconductor substrate or the surface of a feature such as a conductive line, formed over such a substrate. FIG. 2 includes low-k dielectric films 18 and 42. Exemplary low-k dielectric films 18 and 42 may each be formed using PECVD, or other suitable techniques for forming a low-k dielectric film such as available in the art. Low-k dielectric films are characterized by a dielectric constant being less than the dielectric constant of silicon dioxide which is typically about 3.9–4.1. In an exemplary embodiment, the low-k dielectric films may include a dielectric constant that is less than 3.5 Low-k dielectric films are desirably porous, since the incorporation of vacuum having a dielectric contrast of about 1.0, lowers the overall dielectric constant of the low-k dielectric film. In an exemplary embodiment, the low-k dielectric film may be an organo-silicate-glass (OSG). According to an exemplary embodiment, the low-k dielectric material may be a porous low-k dielectric such as SiOC—H, such as may be formed using tetra-methyl-cyclo-tetra-siloxane, oxygen and carbon dioxide using a PECVD-process. According to another exemplary embodiment, the low-k dielectric may be a spin-on aromatic carbon with porogen, that is subsequently baked to create pores. According to other exemplary embodiments, commercially available OSG materials such as Black Diamond (Applied Materials Corporation), Coral (Novellus), FlowFill (Trikon) and Eagel2 (ASM). Such low-k dielectric materials are intended to be exemplary only, and other low-k dielectric films may be used according to other exemplary embodiments. The thicknesses of low-k dielectric films 18 and 42 will vary according to the particular embodiment and may range from 1000 to 10000 angstroms in various exemplary embodiments. Other thicknesses may be used according to other exemplary embodiments.

The film structure shown in FIG. 2 is intended to be exemplary only and the exemplary film stack is suited for use in dual-damascene VLSI processing. According to this exemplary embodiment, the film stack includes barrier layer 6, etch-stop layer 30 and hardmask layer 54. Each of these layers may be considered a "nitrogen base layer" such as a silicon nitride film, a nitrogen-doped silicon carbide film, or other nitrogen containing films. According to another exemplary embodiment, films 6, 30 and 54 may be nitrogen base layers that do not contain nitrogen as a component of the formed film, but may use nitrogen-containing species such as ammonia, nitrous oxide or molecular nitrogen in the formation of the film and thus will include N—H or other nitrogen-including base groups as by-products of the film formation process. In an exemplary embodiment, hardmask film layer 54 may be a silicon oxide film formed using silane, nitrous oxide and nitrogen in a PECVD formation process. Each of layers 6, 30, and 54 are designated nitrogen base layers and include N—H base groups therein which are capable of diffusing out of the respective layers. The films may each be formed using PECVD techniques and may include ammonia, $NH_3$, in the plasma chemistry in an exemplary embodiment.

In another exemplary embodiment, the nitrogen base layer that includes N—H base groups therein and which are capable of diffusing therefrom, may be the surface of another exemplary film, for example a film treated with ammonia or other nitrogen containing chemistries.

Barrier layer 6 includes top surface 8, etch-stop layer 30 includes top surface 32, and hard mask layer 54 includes top surface 56. Generally speaking, one or all of layers 6, 30, and 54 include base groups such as amines or other N—H base groups which are capable of diffusing from the respective films into low-k dielectric films 18 or 42 during or after film formation, if not suppressed. The N—H base groups become nested in the desirably porous low-k dielectric films. Films 12, 24, 36, and 48 suppress such diffusion and maintain any such base groups within respective layers 6, 30, and 54. Films 12, 24, 36, and 48 are oxygen-containing films. According to an exemplary embodiment, such oxygen-containing films may be formed using plasma enhanced chemical vapor deposition of an oxide layer using TEOS (tetraethyl orthosilicate) and oxygen. Such oxygen-containing films formed using these constituents are commonly referred to as TEOS films or TEOS oxide films, in the art. As such, an oxygen-containing film formed using tetraethyl orthosilicate and oxygen will be hereinafter referred to as a TEOS film. In an exemplary embodiment, the TEOS film may include a thickness within the range of 50–100 angstroms, but various other thicknesses may be used in other exemplary embodiments. According to other exemplary embodiments, oxygen-containing films 12, 24, 36 and 48 may be formed using other suitable methods which produce oxygen-containing films and preferably do not generate amines, amino-silanes or other N—H base groups during the film formation process. Oxide films other than TEOS films may be used according to other exemplary embodiments. According to one exemplary embodiment, the oxygen-containing film may be oxygen-doped silicon carbide. Oxygen containing film 12 includes upper surface 14.

The structure in FIG. 2 is intended to be exemplary only and various other numbers of low-k dielectric films and various other nitrogen base layers or other base-containing source films may be used according to other exemplary embodiments. The nitrogen base layers may include nitrogen as a component or they may include N—H or other base groups produced during formation of the film. The nitrogen base layers may serve as hardmask films, barrier layer films, etch stop layers or other films which serve other electrical or structural functions. A fundamental concept of the present invention is that each adjacent film set of a low-k dielectric film and a nitrogen base layer, is separated by a TEOS or other oxygen-containing film, which suppresses diffusion of base species from the base-containing source films to the low-k dielectric material. The TEOS or other oxygen-containing film is advantageously formed directly between the low-k dielectric film and base-containing source film and forms a conterminous boundary with each. In another exemplary embodiment, the nitrogen base layer may be the surface of another film which includes amines or other N—H base groups on its surface after it has been treated with an ammonia-containing plasma, for example.

Figure 3:
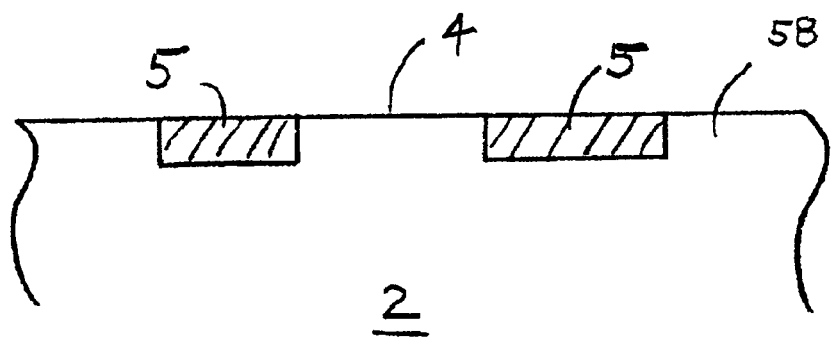
FIG. 3 is a cross-sectional view showing an exemplary substructure of the present invention.

FIG. 3 is a cross-sectional view of an exemplary substructure 2 over which the film stack of the present invention may be formed. Exemplary substructure 2 includes conductive lines 5 and insulating material 58. Conductive lines 5 may be formed of copper or other suitable conductive materials. Surface 4 is generally planar and conductive lines 5 extend down from surface 4 in the embodiment shown. Damascene processing including chemical mechanical polishing may be used to provide conductive lines 5 within generally planar surface 4. Insulating material 58 may be a low-k dielectric or other dielectric material. Substructure 2 shown in FIG. 3 is intended to be exemplary only and other substructures may be used alternatively. As will be shown in the subsequent figures, the exemplary film stack shown in FIG. 2 is preferably formed over a conductive wire as an opening may be formed through the exemplary film stack to contact the subjacent conductive wire.

Figure 4:
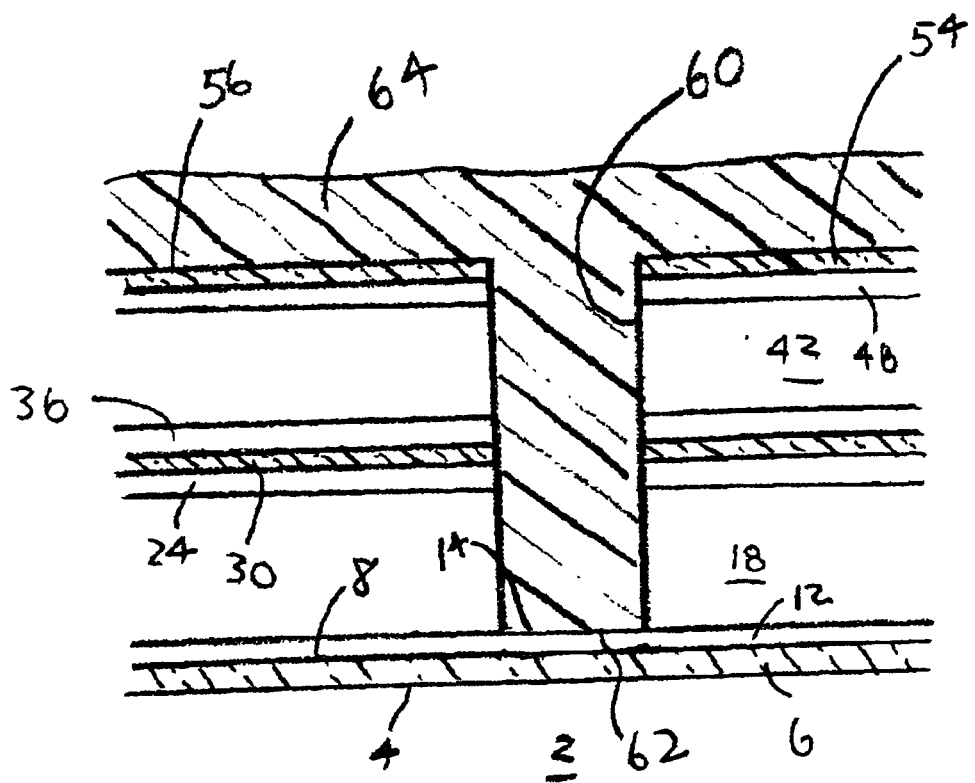
FIG. 4 is a cross-sectional view showing photoresist formed within an opening formed within an exemplary film stack of the present invention.

FIG. 4 is a cross-sectional view showing an opening 60 formed through the exemplary film stack shown in FIG. 2. Opening 60 extends down from top surface 56 of hardmask layer 54 and extends through hardmask layer 54, oxygen-containing film 48, upper low-k dielectric film 42, oxygen-containing film 36, etch-stop layer 30, oxygen-containing film 42, lower low-k dielectric film 18, and terminates on oxygen-containing film 12. Opening 60 includes bottom 62 which is part of upper surface 14 of oxygen-containing film 12. Barrier layer 6 may be formed over a conductive material, separating oxygen containing layer 12 from a subjacent conductive line, such as conductive lines 5 shown in FIG. 3, for example. Various suitable means such as plasma etching may be used to form opening 60. Subsequent to the formation of opening 60, a dual-damascene opening will desirably be formed utilizing opening 60 as a portion of the dual-damascene, or two-tiered opening. As such, photosensitive film 64 is formed over the structure using conventional methods such as by coating. Photosensitive film 64 is formed over top surface 56 and fills opening 60. Photosensitive film 64 may be a commercially-available photoresist such as a DUV photoresist. In an exemplary embodiment, photosensitive film 64 may be a chemically amplified DUV photoresist that includes acid catalysts which render the photoresist material soluble in developer when exposed to ultra-violet light. Other photosensitive materials may be used in other exemplary embodiments. After photosensitive film 64 is formed as shown in FIG. 4, a pattern may be formed within photosensitive film 64 to create the dual-damascene structure.

Figure 5:
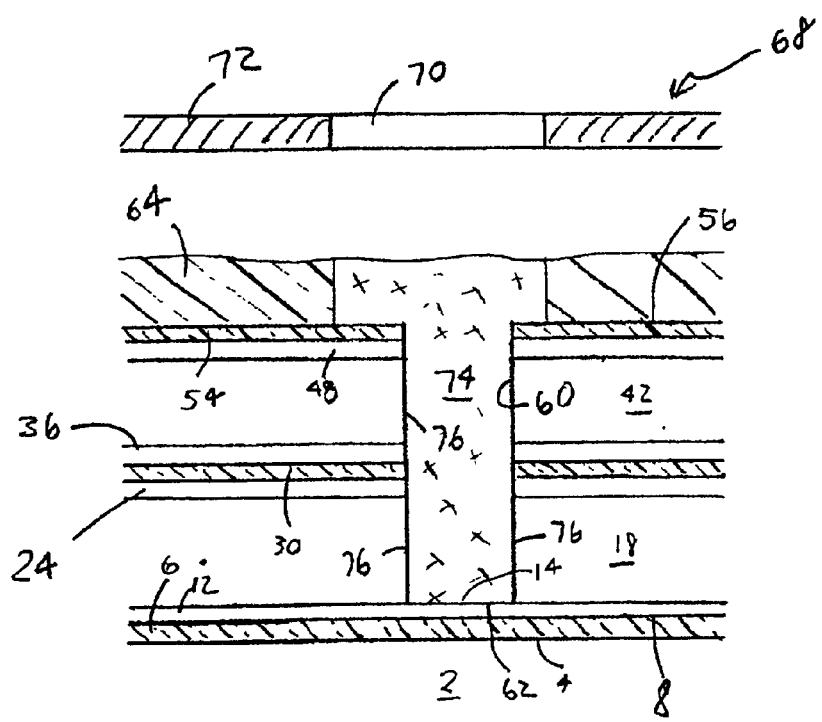
FIG. 5 shows the structure shown in FIG. 4 after portions of the photoresist have been developed.

FIG. 5 shows the structure shown in FIG. 4 after a pattern has been formed using photomask 68. Photomask 68 includes transmissive section 70 and opaque sections 72, chosen to be transmissive and opaque, respectively, to the light used to expose photosensitive film 64. The light used for exposure is chosen in conjunction with photosensitive film 64. In an exemplary embodiment, ultra-violet light may be used in conjunction with a DUV photoresist. When portions of photosensitive film 64 are exposed by a DUV light source through the transmissive pattern formed in photomask 68, the exposed portions of photosensitive film 64 desirably become fully soluble in developer. When a developer subsequently contacts photosensitive film 64, the sections which have been exposed and are soluble in developer, are developed away and a pattern is formed in photosensitive material 64. A substantially identical pattern can then be formed in the underlying structure, such as in the exemplary film stack, using etching or other techniques. FIG. 5 shows exposed section 74 of photosensitive film 64. Exposed section 74 is soluble in developer. Due to the oxygen-containing films 12, 24, 36 and 48 of the present invention, low-k dielectric films 18 and 42 do not include N—H base groups or other nitrogen-containing base groups such as amines or amino-silicates. If present, such base groups could pass through sidewalls 76, interact with the acid catalysts within photosensitive film 64 and render insoluble portions of photosensitive film 64 which are desired to be exposed and soluble in developer such as shown in the Prior Art structure of FIG. 1. Similarly, the presence of oxygen-containing film 12 prevents N—H base groups from diffusing from barrier layer 6 into photosensitive film 64. According to the present invention, exposed section 74 of photosensitive film 64 extends down to bottom 62 and is substantially fully soluble in developer because the acid catalysts in photosensitive film 64 have not complexed with base groups that neutralize the acid catalysts and render them ineffective. The acid catalysts in exposed section 74 of photosensitive film 64 therefore render exposed section 74 soluble in developer after it has been exposed by ultra-violet light. After exposed section 74 has been treated with developer, and removed, an etching process may be used to form the exemplary dual-damascene structure shown in FIG. 6.

Figure 6:
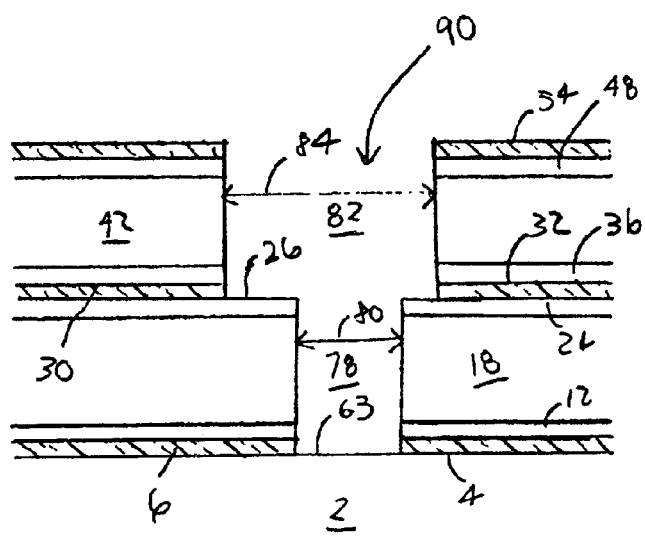
FIG. 6 is a cross-sectional view showing an exemplary dual-damascene opening formed in the exemplary film stack shown in FIGS. 4 and 5.

FIG. 6 shows an exemplary dual-damascene opening 90 formed after the photosensitive film 64 shown in FIG. 5 was developed and portions of the underlying film stack were etched. Various suitable developing and etching process sequences may be used to form the exemplary structure shown in FIG. 6. In an exemplary embodiment, an intermediate etching step may be terminated when etch-stop layer 30 is exposed. FIG. 6 includes exemplary dual-damascene opening 90 which is a two-tiered opening that includes top portion 82 and bottom portion 78. In the exemplary embodiment, bottom portion 78 includes width 80 which is substantially the same as the width of opening 60 from which dual damascene opening 90 is formed. Alternatively stated, exemplary bottom portion 78 is not significantly etched laterally during the etching process used to form dual-damascene opening 90 from the structure shown in FIG. 5. Top portion 82 includes width 84 which is greater than width 80. Top portion 82 extends through hardmask layer 54, oxygen-containing film 48, upper low-k dielectric film 42, oxygen-containing film 36, etch-stop layer 30, and terminates on exposed portions of oxygen-containing film 24. Top portion 82 therefore includes a bottom defined by top surface 26 of oxygen-containing film 24. Bottom portion 78 extends through oxygen-containing films 24 and 12, lower low-k dielectric film 18 and barrier layer 6. Bottom portion 78 extends to bottom surface 63. The structure shown in FIG. 6 is intended to be exemplary only and other dual-damascene structures may be used alternatively. For example, the dual-damascene or two-tiered opening may include an upper portion having a relative width greater than illustrated, and more than one bottom portion which extends to bottom surface 63 and a pillar or unetched section in the bottom portion separating two or more bottom portion openings. The dual damascene opening may subsequently be filled with a conductive material as an interconnect medium. In an exemplary embodiment, the interconnect medium formed within the dual damascene opening may serve as a via to connect a subjacent conductive feature to a superjacent conductive feature. For example, bottom surface 63 may be the top surface of a subjacent conductive line such as conductive line 5 shown in FIG. 3, for example. According to other exemplary embodiments, the interconnect medium may serve other functions.

A fundamental concept of the present invention is that any of various dual-damascene structures may be formed. More particularly, after an opening such as opening 60 shown in FIG. 4, is formed to extend through a low-k dielectric film or a plurality of low-k dielectric films such as the two such films shown in FIG. 4, chemically amplified DUV photoresists may be introduced to the arrangement to effectuate a subsequent pattern. An advantage of the present invention is that when such photosensitive material is introduced to the structure, amine or other N—H base groups do not become nested within the low-k dielectric films and therefore do not diffuse from the low-k dielectric films into the photosensitive film, rendering affected portions insoluble in developer. Pattern distortion is therefore alleviated and insoluble, difficult-to-remove photoresists do not result.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A semiconductor product comprising:
   a low-k dielectric layer;
   a nitrogen base layerformed of nitrogen-doped silicon carbide and including N-H base groups capable of diffusing therefrom; and
   an oxygen-containing layer interposed directly between said low-k dielectric layer and said nitrogen base layer.

2. The semiconductor product as in claim 1, wherein said oxygen-containing layer comprises a TEOS (tetraethyl orthosilicate) oxide film.

3. The semiconductor product as in claim 1, wherein said nitrogen base layer comprises one of a barrier layer film, an etch-stop layer, and a hardmask film.

4. The semiconductor product as in claim 1, wherein said oxygen-containing layer comprises oxygen-doped silicon carbide.

5. The semiconductor product as in claim 1,wherein said nitrogen base layer comprises a surface of a further film.

6. The semiconductor product as in claim 1, in which said semiconductor product includes:
   a lower low-k dielectric layer disposed over a barrier layer;
   an etch-stop layer disposed over said lower low-k dielectric layer;
   an upper low-k dielectric layer disposed over said etch-stop layer;
   a hardmask layer disposed over said upper low-k dielectric layer;
   said nitrogen base layer comprising one of said barrier layer and said etch-stop layer; and said oxygen-containing layer comprising a TEOS oxide layer interposed between said nitrogen base layer and one of said lower low-k dielectric layer and said upper low-k dielectric layer.

7. The semiconductor product as in claim 6, further comprising each of said barrier layer, said etch-stop layer and said hardmask layer being a nitrogen base layer, and a TEOS oxide layer interposed between each said nitrogen base layer and each said adjacent low-k dielectric layer.

8. The semiconductor product as in claim 6, wherein said barrier layer comprises one of said nitrogen base layer formed of nitrogen-doped silicon carbide, and silicon nitride; and said etch-stop layer comprises the other of said nitrogen base layer-formed of nitrogen-doped silicon carbide, and silicon nitride.

9. The semiconductor product as in claim 1, wherein said N—H base groups comprise one of amines and amino-silicates.

10. The semiconductor product as in claim 1, wherein said low-k dielectric layer includes a dielectric constant less than 3.5.

11. The semiconductor product as in claim 1, wherein said low-k dielectric layer comprises one of an organo-silicate-glass and SiOC—H.

12. A semiconductor product comprising:
    a barrier layer formed over a substrate;
    a lower low-k dielectric layer formed over said barrier layer;
    an etch-stop layer formed over said lower low-k dielectric layer;
    an upper low-k dielectric layer formed over said etch-stop layer;
    a hardmask layer disposed over said upper low-k dielectric layer; and
    a TEOS (tetraethyl orthosilicate) oxide film interposed at least one of between said lower low-k dielectric layer and said barrier layer, between said lower low-k dielectric layer and said etch-stop layer, between said etch-stop layer and said upper low-k dielectric layer, and between said upper low-k dielectric layer and said hardmask,
    at least one of said barrier layer and said etch-stop layer formed of nitrogen-doped silicon carbide.

13. The semiconductor product as in claim 12, wherein each of said barrier layer and said etch-stop layer include N—H base groups therein.

14. The semiconductor product as in claim 12, in which a two-tiered opening is formed to extend through said hardmask layer, said upper low-k dielectric layer, said etch-stop layer, said lower low-k dielectric layer, and said barrier layer.

15. The semiconductor product as in claim 14, further comprising a conductive material filling said two-tiered opening, said conductive material serving as an interconnect medium.

16. The semiconductor product as in claim 12, in which an opening is formed to extend through said hardmask layer, said upper low-k dielectric layer, said etch-stop layer and said lower low-k dielectric layer, and further comprising a DUV photoresist formed within said opening.

17. A semiconductor product comprising:
    a low-k dielectric layer;
    a nitrogen base layer including N-H base groups capable of diffusing therefrom; and
    an oxygen-doped silicon carbide layer interposed directly between said tow-k dielectric layer and said nitrogen base layer.

18. The semiconductor product as in claim 17, wherein said nitrogen base layer is formed of nitrogen-doped silicon carbide.

* * * * *